United States Patent
Chen et al.

(10) Patent No.: US 9,647,111 B2
(45) Date of Patent: *May 9, 2017

(54) ADVANCED FORMING METHOD AND STRUCTURE OF LOCAL MECHANICAL STRAINED TRANSISTOR

(71) Applicant: Taiwan Semiconductor Manufacturing Company, Ltd., Hsin-Chu (TW)

(72) Inventors: Chien-Hao Chen, Chuangwei Township (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/068,233

(22) Filed: Mar. 11, 2016

(65) Prior Publication Data

US 2016/0197183 A1 Jul. 7, 2016

Related U.S. Application Data

(63) Continuation of application No. 14/587,679, filed on Dec. 31, 2014, now Pat. No. 9,306,065, which is a continuation of application No. 13/077,641, filed on Mar. 31, 2011, now Pat. No. 8,933,503, which is a (Continued)

(51) Int. Cl.
*H01L 29/78* (2006.01)
*H01L 21/8238* (2006.01)
*H01L 27/092* (2006.01)
*H01L 29/16* (2006.01)
(Continued)

(52) U.S. Cl.
CPC .... *H01L 29/7843* (2013.01); *H01L 21/28123* (2013.01); *H01L 21/823807* (2013.01); *H01L 27/0922* (2013.01); *H01L 29/16* (2013.01); *H01L 29/161* (2013.01); *H01L 29/7833* (2013.01)

(58) Field of Classification Search
CPC ......... H01L 29/7848; H01L 2924/0002; H01L 21/823807; H01L 29/66636; H01L 29/165
See application file for complete search history.

(56) References Cited

U.S. PATENT DOCUMENTS

| 7,045,408 B2 | 5/2006 | Hoffmann et al. |
| 7,202,120 B2 | 4/2007 | Shima et al. |
| 7,205,615 B2 | 4/2007 | Tsutsui et al. |

(Continued)

OTHER PUBLICATIONS

Ge, et al., "Process-Strained Si (PSS) CMOS Technology Featuring 3D Strain Engineering," Electron Devices Meeting, Dec. 8-10, 2003, IEDM Technical Digest, IEEE International, pp. 73-76.

(Continued)

*Primary Examiner* — Tony Tran
(74) *Attorney, Agent, or Firm* — Slater Matsil, LLP

(57) ABSTRACT

Embodiments of the invention provide a semiconductor fabrication method and a structure for strained transistors. A method comprises forming a stressor layer over a MOS transistor. The stressor layer is selectively etched over the gate electrode, thereby affecting strain conditions within the MOSFET channel region. An NMOS transistor may have a tensile stressor layer, and a PMOS transistor may have compressive stressor layer.

20 Claims, 5 Drawing Sheets

Related U.S. Application Data continuation of application No. 11/450,210, filed on Jun. 9, 2006, now Pat. No. 7,935,587.

(51) Int. Cl.
*H01L 29/161* (2006.01)
*H01L 21/28* (2006.01)

(56) References Cited

U.S. PATENT DOCUMENTS

| | | |
|---|---|---|
| 7,238,989 B2 | 7/2007 | Yeo et al. |
| 7,315,063 B2 | 1/2008 | Lee et al. |
| 7,326,587 B2 | 2/2008 | Park et al. |
| 7,335,544 B2 | 2/2008 | Chen et al. |
| 7,442,967 B2 | 10/2008 | Ko et al. |
| 7,528,029 B2 | 5/2009 | Grudowski et al. |
| 7,635,620 B2 | 12/2009 | Chen et al. |
| 7,737,051 B2 | 6/2010 | Dip et al. |
| 7,808,081 B2 | 10/2010 | Bryant et al. |
| 2004/0235236 A1 | 11/2004 | Hoffmann et al. |
| 2004/0251479 A1* | 12/2004 | Tsutsui ............ H01L 21/823807 257/249 |
| 2005/0199877 A1 | 9/2005 | Dip et al. |
| 2005/0230732 A1 | 10/2005 | Park et al. |
| 2005/0272188 A1 | 12/2005 | Yeo et al. |
| 2006/0189056 A1 | 8/2006 | Ko et al. |
| 2006/0292783 A1 | 12/2006 | Lee et al. |
| 2007/0018236 A1 | 1/2007 | Tsuchiaki |
| 2007/0020864 A1* | 1/2007 | Chong ................. H01L 29/165 438/300 |
| 2007/0099360 A1 | 5/2007 | Lee et al. |
| 2007/0111417 A1* | 5/2007 | Bryant ............ H01L 21/823807 438/197 |
| 2007/0249113 A1* | 10/2007 | Grudowski ..... H01L 21/823807 438/199 |
| 2007/0281405 A1* | 12/2007 | Luo ....................... H01L 29/665 438/183 |
| 2008/0128765 A1 | 6/2008 | Chen et al. |
| 2008/0217665 A1 | 9/2008 | Chen et al. |

OTHER PUBLICATIONS

Ghani, et al., "A 90 nm High Volume Manufacturing Logic Technology Featuring Novel 45nm Gate Length Strained Silicon CMOS Transistors," IEEE International Electron Devices Meeting, 2003, IEDM '03 Technical Digest, pp. 11.6.1-11.6.3.

* cited by examiner

ADVANCED FORMING METHOD AND STRUCTURE OF LOCAL MECHANICAL STRAINED TRANSISTOR This application is a continuation of U.S. patent application Ser. No. 14/587,679, entitled "Advanced Forming Method and Structure of Local Mechanical Strained Transistor," filed on Dec. 31, 2014, which is a continuation of U.S. patent application Ser. No. 13/077,641, now U.S. Pat. No. 8,933,503, entitled "Advanced Forming Method and Structure of Local Mechanical Strained Transistor," filed on Mar. 31, 2011, which is a continuation of U.S. patent application Ser. No. 11/450,210, now U.S. Pat. No. 7,935,587, entitled "Advanced Forming Method and Structure of Local Mechanical Strained Transistor," filed on Jun. 9, 2006, which applications are incorporated herein by reference.

TECHNICAL FIELD

This invention relates generally to semiconductor devices, and, more particularly, to methods and structures for controlling strain in transistors to improve device performance.

BACKGROUND

One way to improve transistor performance is through selective application of stress to the transistor channel region. Stress distorts (i.e., strains) the semiconductor crystal lattice, and the distortion in turn affects the band alignment and charge transport properties of the semiconductor. By controlling both the magnitude and distribution of stress in a finished device, manufacturers can increase carrier mobility and improve device performance. There are several approaches for straining the transistor channel region. The details concerning the effects of stress and strain on transistor performance are described in a publication by C. H. Ge et al. in *Process-Strained Si (PSS) CMOS Technology Featuring* 3*D Strain Engineering*, Electron Devices Meeting, Dec. 8-10, 2003, IEDM Technical Digest, IEEE International, which publication is incorporated by reference in its entirety.

One conventional approach includes forming an epitaxial, strained silicon layer on a relaxed silicon germanium (SiGe) layer. Since SiGe has a larger lattice constant than Si, the epitaxial Si grown on SiGe will have its lattice stretched in the lateral direction, i.e., it will be under biaxial tensile stress. In this approach, the relaxed SiGe buffer layer is referred to as a stressor that introduces stress in the channel region. The stressor, in this case, is placed below the transistor channel region. In another approach, stress in the channel region is introduced after the transistor is formed. In this approach, a high-stress film is formed over a completed transistor. The high-stress film distorts the silicon lattice thereby straining the channel region. In this case, the stressor, i.e., the film, is placed above the completed transistor structure.

One problem facing CMOS manufacturing is that NMOS and PMOS devices require different types of stress in order to achieve increased carrier mobility. For example, a biaxial, tensile stress increases NMOS performance approximately twofold. However, for a PMOS device, such a stress yields almost no improvement. With a PMOS device, a tensile stress improves performance when it's perpendicular to the channel, but it has nearly the opposite effect when it is parallel to the channel. Therefore, when a biaxial, tensile film is applied to a PMOS device, the two stress effects almost cancel each other out.

Workers in the art are aware of these problems. Therefore, new CMOS manufacturing techniques selectively address PMOS and NMOS devices. An NMOS fabrication method includes using tensile films to improve carrier mobility. A PMOS fabrication method includes using substrate structures that apply a compression stress to the channel. One PMOS method includes selective application of a SiGe layer into the source/drain regions. Another method uses modified shallow trench isolation (STI) structures that compress the PMOS channel.

The use of additional materials, however, adds further processing steps and complexity to the manufacturing process. Therefore, there remains a need for improving the carrier mobility of both NMOS and PMOS devices without significantly adding to the cost or complexity of the manufacturing process.

SUMMARY OF THE INVENTION

These and other problems are generally solved or circumvented, and technical advantages are generally achieved by preferred embodiments of the present invention that provide a device having improved carrier mobility and its method of manufacture.

Embodiments of the invention provide a semiconductor fabrication and a structure for strained transistors method. A method comprises forming a stressor layer over a MOS transistor. The stressor layer is selectively etched over the gate electrode, thereby affecting strain conditions within the MOSFET channel region. An NMOS transistor may have a tensile stressor layer, and a PMOS transistor may have compressive stressor layer. The stressor layer may comprise a material selected from the group consisting essentially of a silicon-rich nitride, nitrided silicon oxide (SiON), silicon nitride (SiN, $SiN_x$), and combinations thereof.

Note that although the term layer is used throughout the specification and in the claims, the resulting features formed using the layer should not be interpreted together as only a continuous or uninterrupted feature. As will be clear from reading the specification, the semiconductor layer may be separated into distinct and isolated features (e.g., active regions), some or all of which comprise portions of the semiconductor layer. In other embodiments, a layer may refer to a continuous feature having a uniform appearance; yet, it may include regions having different physical or chemical properties.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter or symbol indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The intermediated stages of manufacturing a preferred embodiment of the present invention are illustrated throughout the various views and illustrative embodiments of the present invention.

This invention relates generally to semiconductor device fabrication and more particularly to structures and methods for strained transistors. This invention will now be described with respect to preferred embodiments in a specific context, namely the creation of MOS and CMOS devices. Embodiments of this invention are believed to be particularly advantageous when used in this process. It is also believed that embodiments described herein will benefit other applications not specifically mentioned. Therefore, the specific embodiments discussed, including exemplary parameter values and ranges of values, are merely illustrative of specific ways to make and use the invention, and do not limit the scope of the invention.

Figure 1:
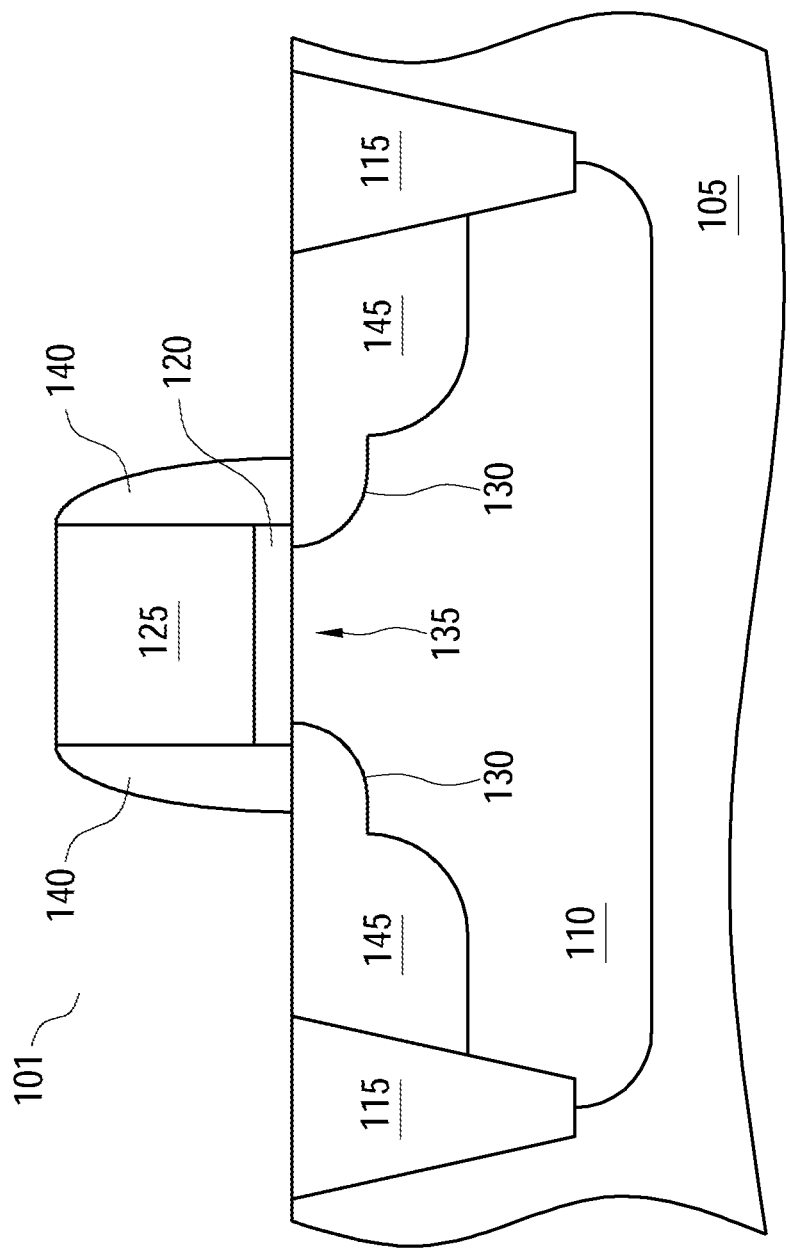
FIGS. 1-5 are cross-sectional views of the fabrication of a strained MOSFET according to embodiments of the invention.

Alternative embodiments of the invention are now illustrated within the exemplary context of a conventional MOS transistor 101 such as that illustrated in FIG. 1. A silicon substrate 105 preferably comprises a p-doped, (100) silicon wafer. The substrate 105 includes an active region 110 suitable for forming semiconductor devices. The active region 110 may, in this embodiment, comprise a doped well region 110, which is of opposite P or N polarity than the substrate 105. In alternative embodiments, the channel/substrate orientation may be selected with a view towards optimizing the appropriate charge carrier mobility using SOI hybrid orientation substrates. For example, a NMOS channel may be oriented along the <100> direction, which is the direction of maximum electron mobility for a {100} substrate. Alternatively, a PMOS channel may be oriented along the <110> direction, which is the direction where hole mobility is maximum for a {110} substrate. The respective device channel has a design width from about 0.05 to 10.0 μm, and preferably less than about 0.5 μm.

An isolation structure, such as a shallow trench isolation (STI) region 115, may be formed within the substrate 101 to isolate active region 110 from other device fabrication regions in the substrate 105. The STI regions 115 are formed using conventional thermal growth methods and isolation region deposition and patterning methods. Formed over the active region 110 is a gate dielectric layer 120. The gate dielectric 120 may include a thermally grown silicon oxide having a thickness from about 5 Å to about 100 Å, and more preferably less than about 20 Å. In other embodiments, the gate dielectric 120 may include a high-k dielectric having a k-value greater than about 4 and may include, for example, hafnium-based materials such as $HfO_2$, $HfSiO_x$, $HfAlO_x$. Other high-k dielectrics may include $Ta_2O_5$, $TiO_2$, $Al_2O_3$, $ZrO_2$, $HfO_2$, $Y_2O_3$, $L_2O_3$, and their aluminates and silicates.

A gate electrode 125 is formed over the gate dielectric 120 layer. The gate electrode 125 may comprise metals, metal alloys, metal-containing materials, polysilicon, polysilicon, and polycide (doped polysilicon/metal silicide stack) gate electrode materials. Preferably, the gate electrode 125 comprises chemical vapor deposition (CVD) polysilicon between about 100 Å and about 10,000 Å thick and more preferably between about 500 Å and about 2,000 Å. The gate electrode 125 may further include about $1E20$ $cm^{-3}$ dopant of polarity opposite the channel region of the corresponding MOS device to be formed therefrom. Such doping advantageously provides for enhanced off current (Ioff) performance, enhanced drain saturation current (Idsat) performance and possibly enhanced short channel effect (SCE) performance of the PMOS device.

An optional glue layer (not illustrated) maybe is formed between the gate dielectric layer 120 and the gate electrode 125. The glue layer promotes adhesion between adjacent layers. It may be formed by CVD of poly silicon, amorphous silicon, TiN, Ti, Ta, TaN, or combinations thereof.

Using the gate electrodes 125 as a mask, lightly doped source/drain (LDS/LDD) regions 130 are formed in the substrate 105 to a depth between about 100 Å and about 1000 Å and preferably between about 200 Å and about 400 Å. An LDS/LDD region 130 is formed by ion implanting a dopant such as boron or phosphorous. After annealing the concentration of phosphorus or arsenic dopant in the LDS/LDD regions 130 is preferably between about $5E16$ atoms/$cm^3$ to about $1E19$ atoms/$cm^3$.

Between the LDS/LDD regions 130 and under the gate electrode there is a channel region 135. Formed on sidewalls of the gate electrode 125 are sidewall spacers 140. The sidewall spacers 140 are a dielectric, such as CVD silicon oxide. Using the gate electrodes 125 and also sidewall spacers 140 as a mask, heavily doped source/drain 145 regions are formed. The source/drain regions 145 may extend below the LDS/LDD regions 130. After annealing, the concentration of dopant in the regions 145 is preferably between about $5E18$ atoms/$cm^3$ and about $5E20$ atoms/$cm^3$. The sidewall spacers 140 may comprise a composite structure formed of several layers.

Figure 2:
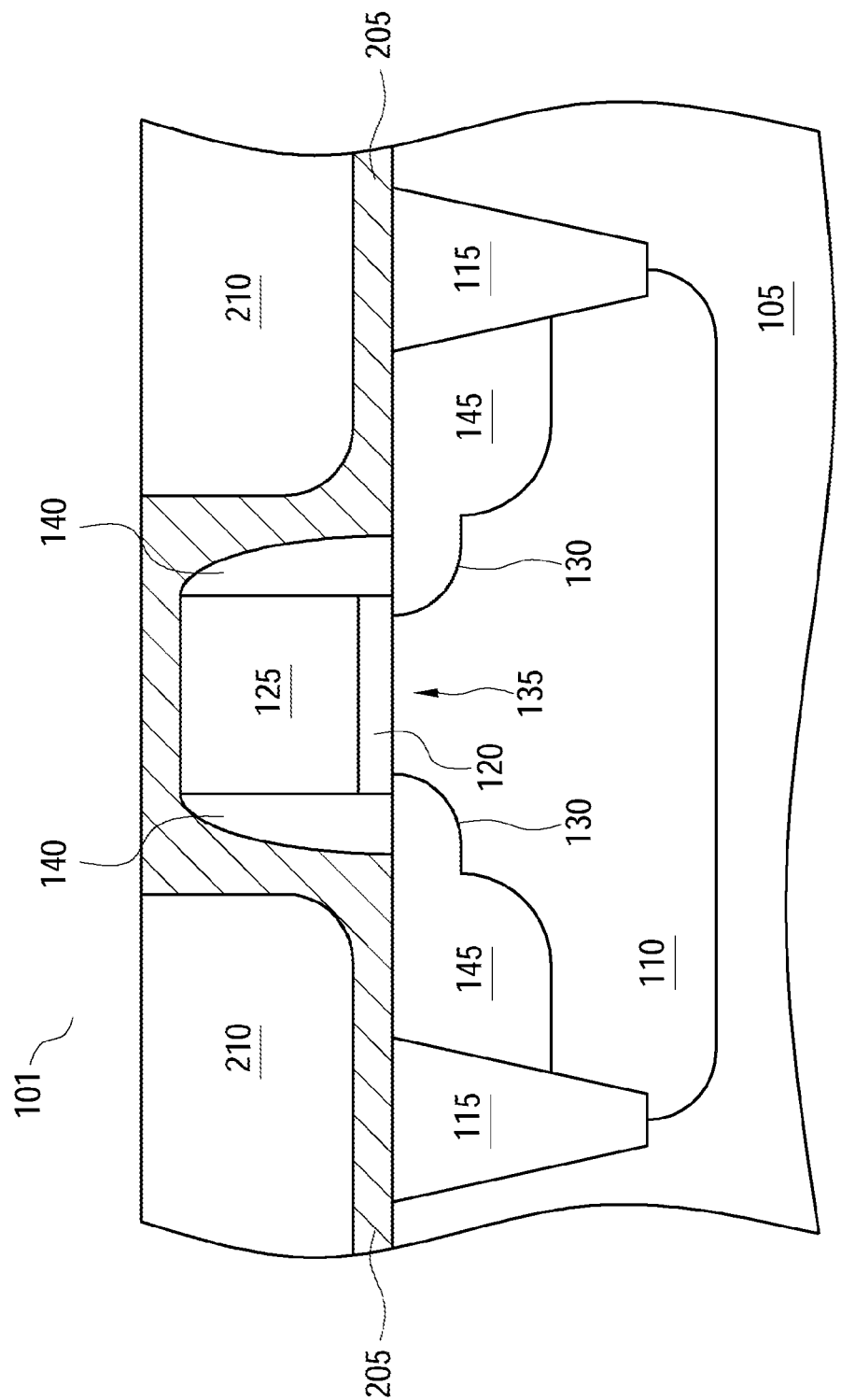

Turning now to FIG. 2 there is illustrated the MOS transistor 101 of FIG. 1, wherein the MOS transistor 101 further comprises a stressor layer according to an embodiment of the invention. The stressor layer 205 may comprise strain-inducing layer suitable for used in advanced semiconductor devices. The stressor layer 205 is preferably about 200 Å to about 1000 Å thick. The stressor layer 205 comprises a tensile stress layer, although in other embodiments it comprises a compressive stress layer. A process used to form the stressor layer 205 may include plasma enhanced chemical vapor deposition (PECVD), low pressure chemical vapor deposition (LPCVD), atomic layer deposition (ALD), rapid thermal chemical vapor deposition (RTCVD), physical vapor deposition (PVD), individually or in combination. The stressor layer 205 may comprise a single layer or a plurality of layers.

In an embodiment, the stressor layer 205 comprises a contact etch stop layer, such as silicon nitride. Stoichiometric silicon nitride films are known to be highly tensile stressed on silicon. However, the tensile stress may be greatly lowered and even turned into compressive stress by adjusting the Si/N ratio. Generally, adding more silicon makes the silicon nitride film more compressive, while adding more nitrogen makes it more tensile. For example, the intrinsic stress of silicon nitride on silicon is preferably adjusted from about 300 MPa to about 1700 MPa by adjusting the Si/N ratio. Stress levels between about −5.0 GPa to about +5.0 GPa, and beyond, are within the scope of embodiments of the invention. The stressor layer thickness may be between about 5 nm and 500 nm.

The stressor layer 205 when compressive is preferably comprised of silicon nitride ($Si_3N_4$ or SiN), silicon oxynitride (SiON), oxide, a Si-rich nitride, or a N-rich nitride. The compressive stressor layer 205 is more preferably SiN or SiON and is most preferably SiON. It has a thickness from about 200 Å to about 1000 Å, and preferably from about 250 Å to about 500 Å. The stressor layer 205 is preferably deposited by plasma enhanced chemical vapor deposition (PECVD). PECVD conditions include a temperature about 300° C. to about 600° C. Deposition time is about 10 seconds to about 500 seconds and preferably from about 20 seconds to about 120 seconds. The reactant $NH_3:SiH_4$ gas ratio is about 4:1 to about 10:1, and preferably less than about 8:1. Alternative reactants include a di-saline:$NH_3$ gas ratio from about 1:4 to about 1:10, and preferably less than about 1:1. The deposition pressure is preferably about 1.0 Torr to about 1.5 Torr. The PECVD power used to form the compressive stressor layer 205 is preferably from about 1000 W to 2000 W and more preferably greater than about 1000 W.

In alternative embodiments, the stressor layer 205 is a tensile stressor layer 205. When the stressor layer 205 is a tensile stress layer, suitable materials include, silicon nitride, tetraethylorthosilicate (TEOS), silicon oxynitride (SiON), oxide, Si-rich nitride, or a N-rich nitride, and it is preferably SiN or SiON. The tensile stressor layer 205 has a thickness from about 200 Å to about 1000 Å, and preferably from about 250 to about 500 Å. The tensile stressor layer 205 is preferably deposited by rapid thermal chemical vapor deposition (RTCVD). The RTCVD temperature is 350° C. to about 800° C., and preferably from about 400° C. to about 700° C. Reaction time is about 10 seconds to about 2000 seconds, and preferably about 20 seconds to about 120 seconds. The NH3:SiH4 gas ratio is about 50:1 to about 400:1, and preferably less than about 700:1. An alternative reactant composition includes a di-saline:NH3 gas ratio about 1:40 to about 1:500, and preferably less than about 1:1. The deposition pressure is preferably about 10 Torr to about 400 Torr, preferably less than about 300 Torr.

Continuing with FIG. 2, a masking layer 210 is formed at least over a portion of the MOS device 101. Masking layer 210 may include a photoresist or a hardmask. Suitable hardmasks include oxides, nitrides, oxynitrides, or silicon carbide, for example. As illustrated in FIG. 2, masking layer 210 is selectively formed over the MOS device 101, and then planarized. Planarizing may be performed using conventional chemical mechanical polishing (CMP) methods. A resist mask may further include a re-flow to enhance the planarization if necessary. The stressor layer 205 may function as a polish stop layer.

The stressor layer 205 as shown in FIG. 2 is known to induce a stress in the channel between 135 the source/drain regions 145 of a MOS device 101. For example, a highly tensile stress/strain film is known to have net tensile stress/strain effect upon the channel region 135. Likewise, a highly compressive stress/strain film is known to induce a compressive channel stress/strain with the channel region 135 of a MOS transistor 101 such as illustrated in FIG. 3.

One problem with a blanket deposition of a stressor layer 205 over a MOS device is that different regions of the stressor layer have different effects upon the channel region. For example, that portion of the tensile stressor layer 205 over the source/drain regions 145 exerts a large tensile force on the channel region 135. In contrast, that portion of the stressor layer 205 over the gate electrode 125 exerts relatively weaker compressive force on the channel region 135. Therefore, the improved MOSFET performance gained from one region of the stressor layer is partially degraded by a competing region of the stressor layer.

Figure 3:
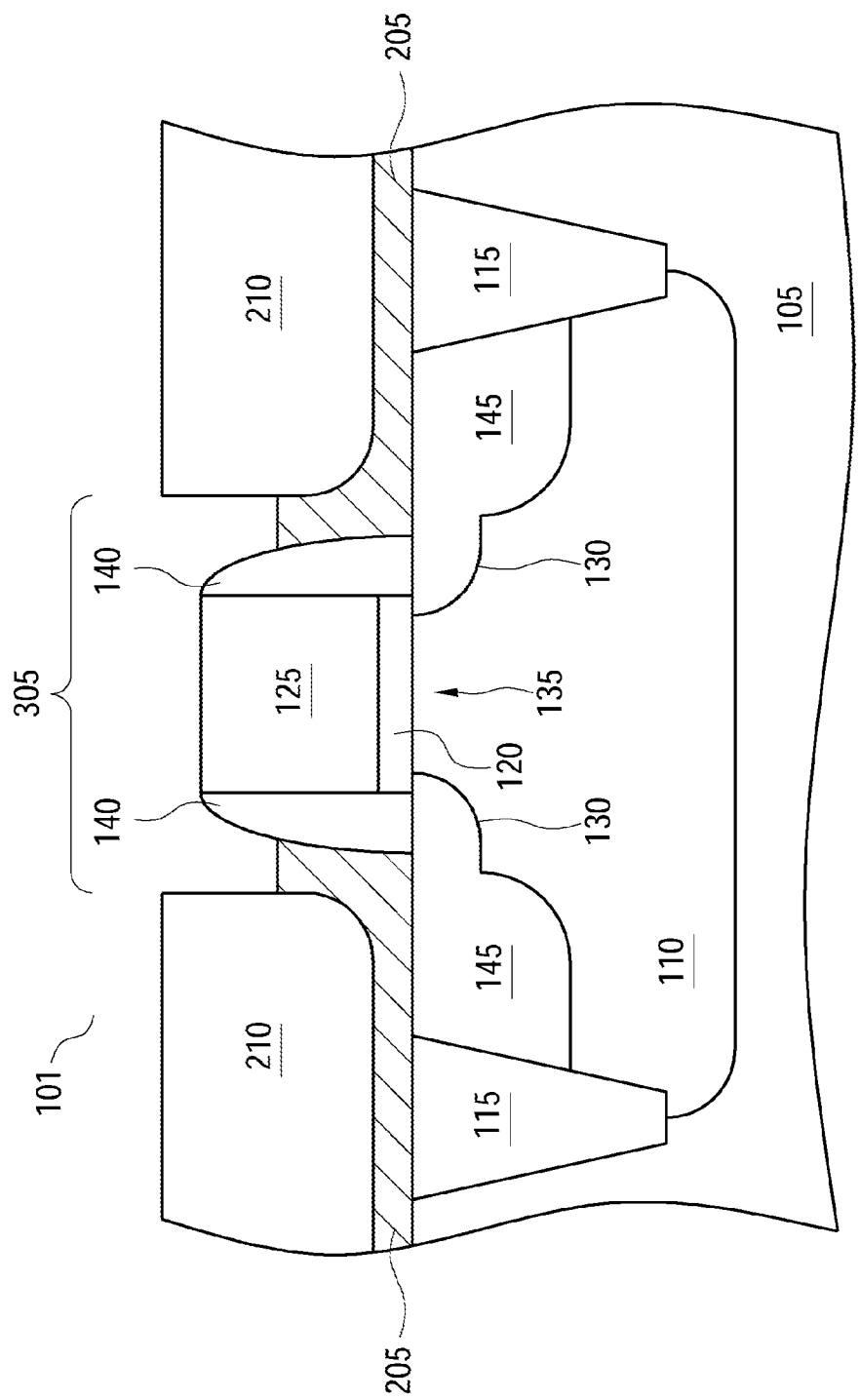
Figure 5:
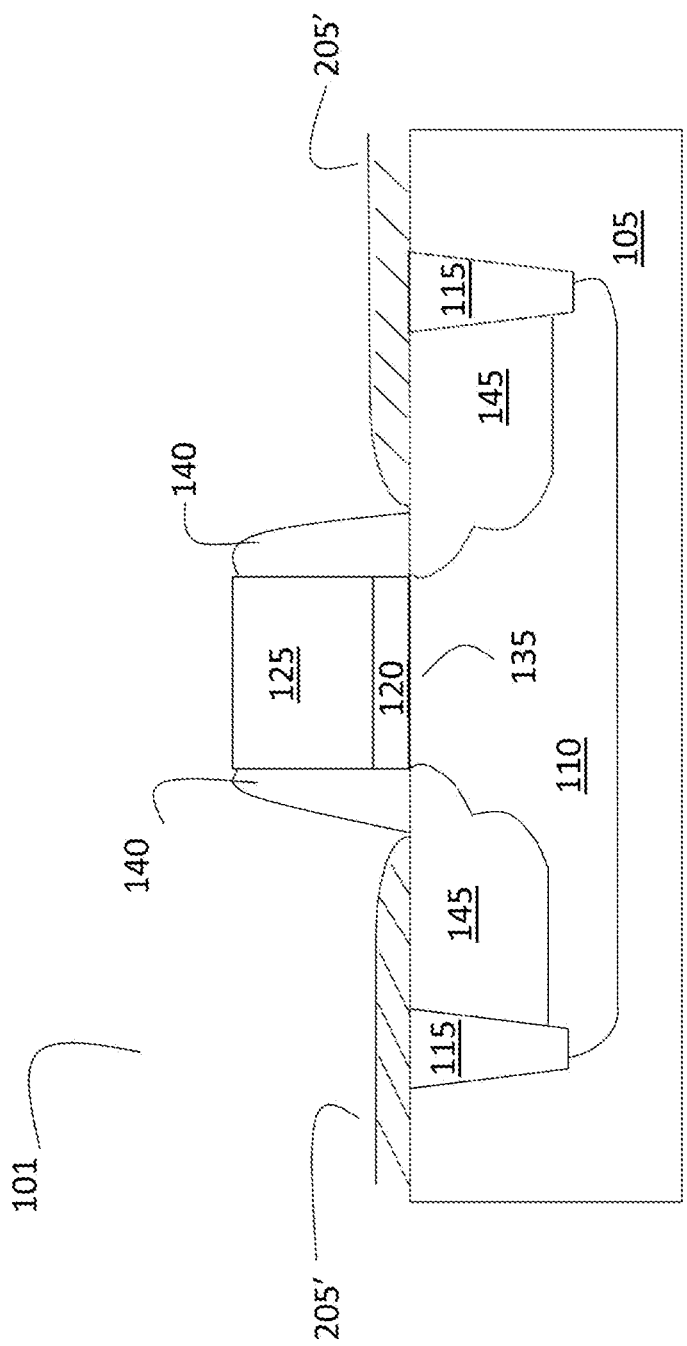

Turning now to FIG. 3, the above discussed problems with stress engineering are addressed by completely removing the stressor layer 205 from over the gate electrode 125 of the MOS device 101. Although it is well known in the prior art to form an opening in a stressor layer over the gate electrode such opening—referred to as contact openings or contacts—are relatively small and do not impact the overall stress applied by the stressor layer. By contrast, it has been found that completely removing stressor layer 205 from over the entire region of gate electrode 125 can have a beneficial impact on the stress applied to channel region 135. Removal can be accomplished by either wet etching or dry etching. Preferably, the removed portion 305 comprises at least that portion of the stressor layer 205 over the gate electrode 125. In other embodiments, the removed portion 305 comprises further comprises some of the stressor layer 205 over the sidewall spacers 140. In other embodiments, the etching completely removes the stressor layer 205 from over the sidewall spacers 140, so that essentially none of the stressor layer 205 contacts the spacers 140. FIG. 5 illustrates an example embodiment, with the stressor layer numbered 205', to distinguish the alternative shape of the stressor layer.

Figure 4:
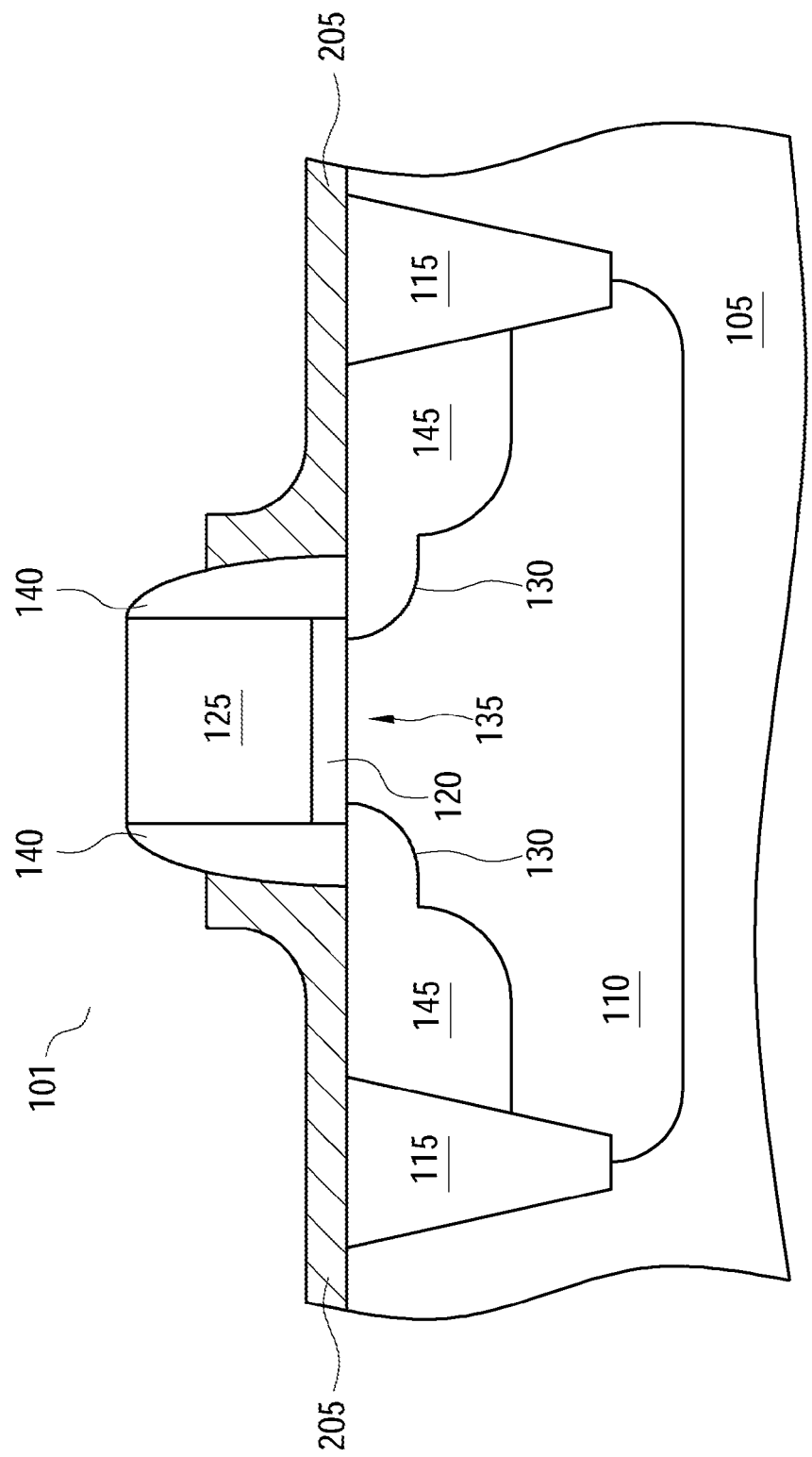

The mask 210 is next removed, thereby producing the structure illustrated in FIG. 4. In an embodiment of the invention, the MOS device 101 is an NMOS transistor, and the stressor layer 205 is a tensile stressor layer. In another embodiment, the MOS device 101 is a PMOS transistor, and the stressor layer 205 is a compressive stressor layer. The combinability of embodiments of the invention makes them suitable for CMOS device fabrication, since NMOS and PMOS devices are selectively treated. In embodiments comprising both NMOS and PMOS devices, devices of opposite polarity may be adjacent or located in different regions of the substrate. After this, the device may be completed (silicide contacts, metallization, ILD layers, etc.) using conventional methods.

The semiconductor device of FIG. 4 is provided to illustrate a useful application of an embodiment of the invention. However, other applications are within the scope of embodiments of the invention. Embodiments are not limited to transistors as the invention relates more generally to forming strained semiconductor devices. For example, an embodiment provides a method of fabricating a strained channel transistor. The method comprises forming a gate electrode over a substrate. The substrate may comprise a semiconductor crystal, wherein an interatomic distance between neighboring atoms in the semiconductor crystal is defined by a substrate lattice spacing. The method further includes adjusting the substrate lattice spacing under the gate electrode. For a silicon substrate, the substrate lattice spacing is about 5.4 Å (silicon=5.4295 Å) at about 25° C. Adjusting the lattice spacing may induce a strain under the gate electrode, i.e. the carrier channel, by at least about 0.1% or about 0.0054 Å. The adjusting preferably comprises forming strained layer over the gate electrode and over the substrate, and removing a portion of the strained layer from over the gate electrode.

In an embodiment, a method of forming a semiconductor device is provided. The method includes forming a raised structure on a substrate, forming a stressor layer over the raised structure, forming a mask layer over the stressor layer, and patterning the mask layer to expose a first portion of the stressor layer directly above the raised structure, a second portion of the stressor layer remaining covered by the mask layer after patterning the mask layer. After patterning the mask layer, the first portion of the stressor is removed, at least a portion of sidewalls of the raised structure being exposed after removing the first portion of the stressor, the second portion of the stressor layer remaining covered by the mask layer after removing the first portion of the stressor, and after removing the first portion, the mask layer is removed.

In yet another embodiment, a method of forming a semiconductor device is provided. The method includes forming a gate electrode having a pair of sidewall spacers over a substrate, forming a stress layer over the gate electrode, the sidewall spacers, and the substrate, the stress layer comprising a first portion over gate electrode and the sidewall spacers and a second portion, the gate electrode and the sidewall spacers not being interposed between the second portion and the substrate, and forming a mask layer over the stress layer. The mask layer is planarized to expose the first portion of the stress layer, and the first portion of the stress layer is removed to expose the gate electrode while the mask layer remains over the second portion. After removing the first portion of the stress layer, the mask layer is removed.

In still yet another embodiment, a method of forming a semiconductor device is provided. The method includes forming a gate electrode and spacers over a substrate, the spacers being positioned on opposing sides of the gate electrode, forming a strained layer over the gate electrode, over the spacers, and over the substrate, and forming a mask over at least a portion of the strained layer such that the strained layer over the gate electrode is exposed. The method further includes removing the strained layer from over the gate electrode such that the strained layer does not contact the gate electrode, at least a portion of sidewalls of the spacers being exposed after the removing, and removing the mask.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a raised structure on a substrate;
    forming a stressor layer over the raised structure;
    forming a mask layer over the stressor layer;
    patterning the mask layer to expose a first portion of the stressor layer directly above the raised structure, a second portion of the stressor layer remaining covered by the mask layer after patterning the mask layer;
    after patterning the mask layer, removing the first portion of the stressor layer, at least a portion of sidewalls of the raised structure being exposed after removing the first portion of the stressor layer, the second portion of the stressor layer remaining covered by the mask layer after removing the first portion of the stressor layer, the second portion of the stressor layer having an exposed uppermost surface extending horizontally away from the raised structure, the exposed uppermost surface of the second portion being lower than an uppermost surface of the raised structure; and
    after removing the first portion, removing the mask layer.

2. The method of claim 1, wherein the raised structure comprises a transistor gate and spacers along sidewalls of the transistor gate.

3. The method of claim 2, wherein after removing the first portion, no portion of the stressor layer contacts the transistor gate.

4. The method of claim 2, wherein the removing the first portion of the stressor layer completely removes the stressor layer from sidewalls.

5. The method of claim 1, wherein the stressor layer is about 200 to 1000 Å thick.

6. The method of claim 1, wherein patterning the mask layer further comprises planarizing the mask layer and the stressor layer so that the mask and stressor layers are coplanar.

7. A method of forming a semiconductor device, the method comprising:
    forming a gate electrode having sidewall spacers over a substrate;
    forming a stress layer over the gate electrode, the sidewall spacers, and the substrate, the stress layer comprising a first portion over gate electrode and the sidewall spacers and a second portion, the gate electrode and the sidewall spacers not being interposed between the second portion and the substrate;
    forming a mask layer over the stress layer;
    planarizing the mask layer to expose the first portion of the stress layer, the mask layer having a planar upper surface;
    recessing the first portion of the stress layer to expose the gate electrode while the mask layer remains over the second portion, the recessing the first portion of the stress layer forming a recessed top surface of the first portion of the stress layer, the recessed top surface below a topmost surface of the mask layer; and
    after removing the first portion of the stress layer, removing the mask layer.

8. The method of claim 7, wherein removing the first portion of the stress layer exposes sidewalls of the sidewall spacers.

9. The method of claim 7, wherein removing the first portion of the stress layer comprises using a selective etch process.

10. The method of claim 7, wherein the stress layer is about 200 to 1000 Å thick.

11. The method of claim 7, wherein an intrinsic stress of the stress layer is at least about 500 MPa.

12. The method of claim 7, wherein the planarizing the mask layer includes using the stress layer as a polish stop layer.

13. The method of claim 7, wherein the stress layer comprises a silicon-rich nitride.

14. A method of forming a semiconductor device, the method comprising:
- forming a gate electrode and spacers over a substrate, the spacers being positioned on opposing sides of the gate electrode;
- forming a strained layer over the gate electrode, over the spacers, and over the substrate;
- forming a mask over at least a portion of the strained layer such that the strained layer over the gate electrode is exposed, the mask having an exposed topmost surface;
- removing the strained layer from over the gate electrode such that the strained layer does not contact the gate electrode, at least a portion of sidewalls of the spacers being exposed after the removing, a topmost surface of the strained layer directly contacting the spacers being horizontal, the topmost surface of the strained layer being lower than a topmost surface of the sidewalls of the spacers; and
- removing the mask.

15. The method of claim 14, wherein forming the mask comprises: forming the mask to completely cover the strained layer; and planarizing the mask to expose the strained layer directly above the gate electrode.

16. The method of claim 15, wherein planarizing the mask comprises reflowing the mask.

17. The method of claim 14, wherein a substrate lattice spacing under the gate electrode is adjusted at least 0.10%.

18. The method of claim 14, wherein the strained layer comprises a material selected from the group consisting essentially of germanium, carbon, silicon, silicon germanium, a carbide, a nitride, and combinations thereof.

19. The method of claim 14, wherein removing the strained layer completely removes the strained layer from surfaces of the sidewall of the spacers.

20. The method of claim 14, wherein an intrinsic stress of the strained layer is at least about 500 MPa.

* * * * *